US008614571B2

(12) United States Patent
Tseng et al.

(10) Patent No.: US 8,614,571 B2
(45) Date of Patent: Dec. 24, 2013

(54) APPARATUS AND METHOD FOR ON-CHIP SAMPLING OF DYNAMIC IR VOLTAGE DROP

(75) Inventors: Nan-Hsin Tseng, Tainan (TW); Chin-Chou Liu, Jhubei (TW); Saurabh Gupta, Hsinchu (TW); Ji-Jan Chen, Hsinchu (TW); Chi Wei Hu, Pingzhen (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 251 days.

(21) Appl. No.: 13/299,445

(22) Filed: Nov. 18, 2011

(65) Prior Publication Data

US 2013/0127441 A1    May 23, 2013

(51) Int. Cl.
*G01R 19/00*    (2006.01)
*G01R 27/08*    (2006.01)

(52) U.S. Cl.
USPC ........................................ 324/76.11; 324/713

(58) Field of Classification Search
USPC ......... 324/76.11, 713, 605, 602, 600; 327/52, 327/149, 153, 158, 161
See application file for complete search history.

(56) References Cited

U.S. PATENT DOCUMENTS

| | | | |
|---|---|---|---|
| 6,946,846 B2 | 9/2005 | Corr | |
| 7,339,357 B2 | 3/2008 | Lopata | |
| 7,560,936 B1 | 7/2009 | Hronik | |
| 7,952,370 B2 | 5/2011 | Ferraiolo et al. | |
| 2006/0197503 A1* | 9/2006 | Arai et al. | 320/132 |
| 2006/0197697 A1 | 9/2006 | Nagata | |
| 2006/0202857 A1* | 9/2006 | Kawahara et al. | 340/870.02 |
| 2007/0033565 A1* | 2/2007 | Ohyabu et al. | 716/17 |
| 2008/0218152 A1* | 9/2008 | Bo | 324/76.11 |
| 2009/0091370 A1* | 4/2009 | Kawasaki | 327/365 |
| 2009/0125858 A1 | 5/2009 | Vishweshwara et al. | |
| 2009/0140749 A1* | 6/2009 | Spah | 324/600 |
| 2012/0126781 A1* | 5/2012 | Narayanan et al. | 324/76.11 |

OTHER PUBLICATIONS

"Automatic Test Equipment", from Wikipedia, http://en.wikipedia.org/wiki/automatic_test_equipment, 7 pages.

\* cited by examiner

*Primary Examiner* — Hoai-An D Nguyen
(74) *Attorney, Agent, or Firm* — Duane Morris LLP

(57) ABSTRACT

Test points on an integrated circuit chip, especially points subject to IR voltage drop along power supply rails, are coupled to comparators controlled by an automatic test controller, all included on the chip. Each test point can have one or more comparators and one or more reference voltages over a testing range. A change of state at a comparator sets a latch that is read and reset by the on-chip automatic test controller during test intervals. The automatic test controller can coordinate with external automatic test equipment that applies stimulus signals to the chip during testing. The greatest voltage drop during a test interval is determined from the latched output of the switched comparator coupled to the lowest reference voltage. The setting and resetting of the latch can be gated through a selectable delay so as to discriminate for excursions that persist for a longer or shorter time.

18 Claims, 4 Drawing Sheets

APPARATUS AND METHOD FOR ON-CHIP SAMPLING OF DYNAMIC IR VOLTAGE DROP

BACKGROUND

This disclosure concerns techniques and circuits for detecting IR voltage drop conditions at one or more circuit test points during operation of an integrated circuit, using comparator circuits carried on the integrated circuit to generate signals that represent the amplitude of an IR voltage drop at one or more monitored test points compared to reference voltage(s). The comparator circuits can discriminate for pulses based on pulse width, and store the state of one or more comparators at predetermined times in a testing cycle. In this way, occurrences of IR voltage drops can be associated with dynamic circuit operations.

A conductor that connects between two points in a circuit has an electrical resistance R determined by the conductor material and dimensions. The conductor carries a current I proportional to the difference V in voltage between such points, according to Ohm's Law: V=IR. When an electrical load in a circuit is supplied with current from a supply voltage through a conductor, the voltage at the load is equal to the supply voltage level less a voltage drop equal to the product of the resistance of the conductor times the current passing through the conductor. Depending on the operational state of the circuit, loads may draw a variable amount of current at any given time. The operational state of the circuit varies with the conductive state of switching elements and with the input stimulus and output voltages and currents, whether reactive elements are charging or discharging, etc.

Circuit loads are coupled across a potential difference by two conductors, i.e., between different voltages. An IR voltage drop occurs along a conductor carrying current from a $V_{DD}$ supply voltage (or other reference) to the more positive terminal of the load, leading to a reduced or drooping supply voltage at that terminal. Another IR drop occurs along a conductor from the more negative other terminal of the load to a ground potential (or other reference), leading to an elevated supply voltage at such other terminal, sometimes called ground bounce. The resistances of the load and the two conductors coupling the load to the supply voltages form a voltage divider. When the load is carrying current, the IR voltage drops along the two supply conductors reduce the potential difference that is applied across the load, compared to the case where no current or less current in being conducted. The load might require a minimum potential difference for acceptable performance.

Positive and ground (or negative) supply voltages are coupled to integrated circuits via power supply inputs at the chip level or at the chip package level, and within the chip or package, various load devices are supplied by conductive connections between the power supply inputs and the loads. The internal power supply conductors, sometimes termed power supply rails, may trace paths across the area of the chip in a grid of conductors, as well as up and down through connecting vias between superimposed semiconductor layers. Individual conductors may comprise narrow strips of thinly deposited metal alloys, polycrystalline silicon or other materials. Although the integrated circuit package as a whole is a load on the power supply, the operational devices within the integrated circuit likewise are internal loads. Power supply conductors as well as signal conductors are subject to IR voltage drops along conductors within the integrated circuit package or chip.

IR voltage drop considerations are important during integrated circuit design and planning stages. Alternative circuit layouts can be considered in view of the expected IR voltage drop conditions and the requirements of the load devices. IR drops are calculated based on the resistivity of the conductor material, the cross sectional dimensions of the conductor, the length of the conductor between defined points, typical operational states of the circuit such as the number of switching elements toggling simultaneously, and the expected current loading. If it appears that a load device may be adversely affected by IR voltage drop conditions, the load device may be moved to a location closer to a more regulated source along the power supply rails, i.e., to reduce conductor length, or the conductors can be made wider or thicker, in either case reducing their resistance.

Accounting for the IR drops associated with loads can be a complicated matter due, for example, to the complexity and variable shapes of conductive paths. Some programmed layout planning systems have a function for estimating IR voltage drop, but it is also advantageous to provide a way to test practical circuits to determine whether assumptions made during layout planning can be proved on regularly manufactured chips. For early manufacturing process development, testing also helps to adjust and fine-tune models and technology files. A designer might choose to provide power rail conductors that are more than sufficient in number and size, but this uses scarce circuit area. It is desirable to scale down all elements including conductors, to as small a size as needed to support the load devices. At the same time, it is desirable to allow some leeway to accommodate for process variations.

The current drawn by circuit loads can vary from time to time due to the operational state of the circuit. For example, circuits may have reactive aspects (capacitance and inductance) and switching and amplifying circuit devices (e.g., transistors, diodes) that dynamically affect the currents flowing through loads and along conductors. If a load that is closer to the regulated voltage source begins or increases the draw of current, the associated IR voltage drop reduces the supply voltage at that load and at other loads that are farther away from the regulated voltage source along a power supply rail or similar conductor.

Differences in operational states of switched and high frequency circuits cause current loading conditions to vary over short time periods. In the example of a static random access memory chip, for example an SRAM array with bit cells comprising cross coupled inverters, the inverter inputs and outputs are allowed to float until the particular bit cell is addressed, whereupon load currents are produced in the circuit depending on which word lines and bit lines are active, the logic state of the bit cells, and the location of the bit cells on the chip. Operations like this can produce a brief but considerable IR drop across the conductors in the chip, including but not limited to the power supply rails.

Modeling can be used to predict voltage drops under various assumed current and operational conditions. However, an effective and efficient technique for actually measuring voltage drop conditions would be useful for verifying a circuit design, i.e., to confirm that IR voltage drops measured when a nominal integrated circuit design is actually manufactured and operated, are such that sufficient supply voltages are available when needed by the various load devices. In this way, testing verifies the dependability of circuits under worst case operational conditions and accounting for normal manufacturing process variations.

To prove a design, prototypes of integrated circuit chips might be tested more or less extensively. After a production run, a statistical sampling of manufactured chips can be tested. It is possible to test every one of the chips or chip packages produced in a manufacturing run, using automated test equipment. "Automatic Test Equipment" in this context, sometimes abbreviated "ATE" refers to stand alone test apparatus that is used to test manufactured chips, on the wafer or after packaging of the chips. The Automatic Test Equipment may be coupled to inputs and outputs of the chip or package, or may be coupled to defined points on the chip circuits by contacts. The Automatic Test Equipment applies a stimulus to exercise some or all of the circuits on a chip or package under test, and determines whether or not such circuits respond appropriately. The Automatic Test Equipment may be configured to execute combinations of predetermined input signals as stimuli that are expected to produce predetermined output signals or functions, and to advance in sequence to other predetermined combinations. Automatic Test Equipment can be arranged to make contact with surface-accessible conductors within the circuit under test, as opposed to externally accessible inputs and outputs, in more or less complicated and intrusive regimens of exercising and testing the circuit.

Automatic Test Equipment might be capable of testing voltage conditions at points of contact with an integrated circuit or package. It is not readily possible with a stand-alone external Automatic Test Equipment apparatus to sense voltage and current conditions at various points within an integrated circuit, including points that are potentially deep within an array of elements on the chip and not directly accessible through signal lines available off the chip or even on a readily accessible surface. The number and locations of test points accessed using Automatic Test Equipment are limited for practical reasons.

A technique is needed that may provide useful and potentially extensive test information wherein on-chip circuits provide test information derived from various circuit points that might not be accessible to an external Automatic Test Equipment apparatus. Advantageously, the technique should complement the capabilities of the Automatic Test Equipment, for example by producing signals that result from diagnostic testing and are fed to the Automatic Test Equipment as opposed to coupling signals directly from the circuit conductors to the Automatic Test Equipment for testing voltage, current, timing or other parameters.

Test techniques are needed that are optimal for prototype testing, when proving and finalizing design choices, as a quality assurance testing technique associated with production, and as an ongoing operational measurement, for operational assurance or for varying operations, for example in circuits that use variable voltage regulation devices to limit power consumption. It is useful for such devices and techniques to be capable of discerning short term IR drop conditions such as infrequent spikes associated with specific circuit conditions, and preferably to distinguish between shorter and longer term IR drops at supply voltages to particular loads, in a way that permits the IR drops to be associated with operational states of the load devices.

SUMMARY

Among other objects, it is desirable to provide for efficient and effective IR drop measurement capabilities at test points distributed over in an integrated circuit, by providing on-chip threshold detection and on-chip storing elements such as registers or latches for storing digital values and signals that identify IR drops that may occur briefly at predetermined test points and may relate to operational conditions of an integrated circuit device under test.

Another object concerns controlling the operation of the threshold detection and registers or latches using an on-chip test controller that resides on the chip itself and controls or helps to control the sequence of events that are effected for testing and monitoring for IR drop conditions. In an embodiment, an on-chip automatic test controller not only controls the sequence of events for collecting digital values that represent IR voltage drop test results, but the automatic test controller also communicates with an external Automatic Test Equipment apparatus for reporting the IR voltage drop test results. In another variation, the on-chip automatic test controller can obtain instructions from the external Automatic Test Equipment to determine one or more of the stimulus applied to the circuit, the parameters employed by the on-chip automatic test controller, and especially to apply pulse duration criteria enabling threshold detection comparators, latches and registers to discern and report through the automatic test controller to the Automatic Test Equipment, regarding longer or shorter persisting voltage spikes or excursions at the test points.

The IR drop monitor circuit along with testing process as disclosed herein is apt for verifying and potentially correcting the correlation of IR drop simulations versus actual execution in silicon. This technique provides a way to distinguish between design related IR conditions and those that may arise from differences in production process parameters. In certain embodiments, on-chip comparators and registers develop digital values conveyed to one or more on-chip automatic test controllers. And information thereby collected are coupled to through the automatic test controllers for reporting upwardly to external Automatic Test Equipment. In some embodiments, a patterned series of input signals or values or criteria such a is likewise conveyed downwardly from the Automatic Test Equipment to control one or more operational aspects of the circuit, for example to effect a planned testing pattern or procedure.

The IR voltage drop can be assessed at one or more test points along a $V_{DD}$ power supply rail, as predetermined test points. It can be inferred that the current level in the $V_{DD}$ power supply conductor will correlate with similar current levels associated ground conductors. It can be inferred that the current levels will likewise correlate for different power supply conductors that are in similar conditions as to loads, are located nearby one another on the chip and were produced in the same manufacturing process. A reference voltage is coupled to one input of a voltage comparator and the other input of the comparator is coupled to one such test point. The reference voltage can be provided as a DC threshold level from a selected tap on a voltage divider defining several thresholds or at least providing a proportional voltage division between predetermined reference voltages. In one embodiment, procedures are provided to determine the offset in the switching voltage of the comparator for improved accuracy.

One or more comparators detects an IR voltage drop by discriminating for a voltage at the associated test point that is higher or lower than a detection threshold determined by the a reference voltage coupled the respective comparator. Several comparators with threshold switching voltages that differ incrementally over a range can be coupled to the same test points. The output of each comparator sets a latch if or when the output of the comparator changes state because the test point voltage coupled to one comparator input falls below the threshold voltage coupled to the other comparator input (subject to calibrated comparator switching offset). In the case of plural comparators, the states of the latches are loaded into output registers, thereby providing a plural bit digital word indicating the lowest threshold voltage that the test point passed during a particular test interval. The automatic test controller or an associated timing circuit defining test intervals resets the latch to enable a new test cycle.

In one embodiment, the test cycles are coordinated with a test sequence or pattern of input or control signals applied by an Automatic Test Equipment apparatus coupled to an automatic test controller that is embodied on the same chip as the circuit under test. The test cycles progress through a predetermined series of input signal conditions so as to exercise the circuit. The test pattern exercises different parts of the circuit at different steps in the test pattern. By noting the timed intervals at which IR drop conditions were acceptable or marginal or unacceptable based on digital word values derived from the outputs of comparators coupled to different switching threshold reference voltages, the Automatic Test Equipment associates detected IR voltage drop conditions with the operational states of the exercised circuit. In this manner the circuit can be tested according to a plan for examining a distributed set of test points considered representative, or particular test points considered crucial to operations, or particular test points that are suspect, e.g., due to their placement at points along the power supply rails that are remote from regulated voltage supply points. The supply voltage levels at remote points along the rails are affected by voltage drops from variable current supplied to all the associated loads, including current conducted through sections of the rails that are closer to the regulated voltage supply points than the remote points.

In certain embodiments, the coupling of the comparators to the laches provides a selectable pulse width windowing feature, enabling longer and shorter duration voltage drops to be distinguished and likewise associated with particular points in time, such as the clock cycles of an automatic test device, or the operational cycles of a wholly on-chip self-testing arrangement. The resulting data can be reported to the Automatic Test Equipment, or to a similar apparatus, in digital form.

BRIEF DESCRIPTION

There are shown in the drawings exemplary embodiments intended to illustrate aspects of the subject matter disclosed. The subject developments are not limited to the embodiments illustrated as examples, and reference should be made to the claims to assess the scope of the subject matter. In the drawings, FIG. 1 is a diagram schematically representing an exemplary integrated circuit chip, having an arbitrary arrangement of power supply rails and test points for purposes of discussion.

DETAILED DESCRIPTION

Figure 1:
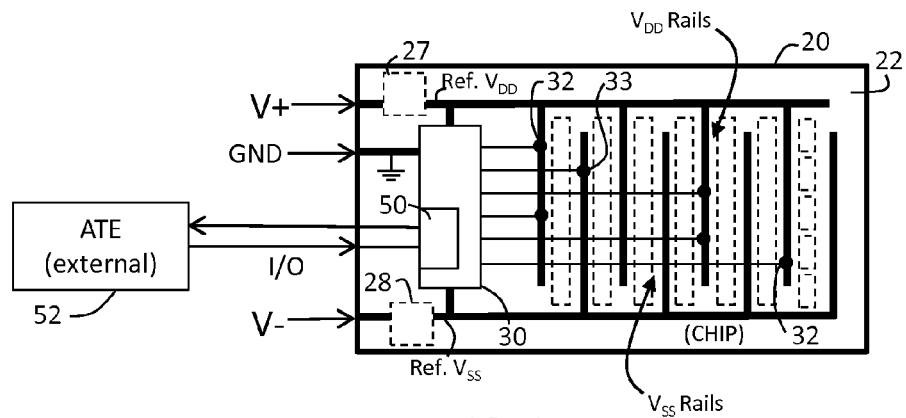

FIG. 1 is a simplified illustration of an integrated circuit or chip 20, shown generally and representing any arbitrary layout of load elements coupled by conductors to voltage supply points and drawing current through the conductors so as to experience IR voltage drops. The circuit 20 comprises a silicon substrate 22 in which are provided various circuit elements that include active switching devices, for example. The conductors in the integrated circuit have characteristic electrical resistance due to their material, cross sectional dimensions and length. The integrated circuit also has reactive aspects (capacitance and inductance). This disclosure is applicable to various specific integrated circuit types, and accordingly the specific elements on the chip 20 are not shown in detail. The elements are defined and are connected to one another by a potentially complex layout of overlapping, connecting or bypassing layers of N and P semiconductor materials forming transistors and diodes, metal oxide gates, polysilicon or metal oxide conductors and other similar elements. The elements can be located in discrete functional block areas of the circuit space, such areas being shown generally in FIG. 1 as broken line blocks. The elements are connected to external circuits, for example using connector pads (not shown), at least some of which are used for coupling external power to the circuit or chip 20. In this example, a more positive supply voltage V+, a ground potential GND and a more negative supply voltage V− are provided from external supplies (not shown).

The positive and negative supply voltages could be regulated voltages coupled through on-chip conductors to the various elements that operate as circuit loads. It is also possible as shown in FIG. 1 that the external voltages V+ and V− can be regulated by one or more on-chip voltage regulators 27, 28 that supply predetermined regulated voltages Ref. $V_{DD}$ and/or Ref. $V_{SS}$. In either case, there is a point on the conductors on the chip that is proximal to the regulator that provides the respective supply voltage to the loads on the chip (whether the regulator is on the chip or external). In the example of FIG. 1, positive reference voltages $V_{DD}$ and $V_{SS}$, are respectively provided by regulators 27, 28, which can be, for example, series regulators that maintain $V_{DD}$ and $V_{SS}$ at levels determined according to an internally defined reference voltage. Likewise, there are various points along the conductors that couple the voltage supplies to the loads, and ultimately there is a point at which the voltage supply is coupled to each load terminal. The conductors have a characteristic resistance, and a voltage drop occurs along the conductors between the supplies and the load terminals, which drop is a function of the conductor resistance and the amplitude of current flowing, in each incremental part of the conductor back to the reference voltages.

As show in the example of FIG. 1, the power supply voltages $V_{DD}$ and $V_{SS}$ and preferably also GND are coupled along power supply rails $V_{DD}$ Rail and $V_{SS}$ Rail, routed from the regulators up to and into the active circuit area at which various load devices (shown generally by broken line blocks) are coupled to the power supply rails. The layout of the load devices and the power supply rails is arbitrary; however it must be noted that there is an IR voltage drop along the power supply conductors including the power supply rails, between the points designated as a reference (such as the outputs of voltage regulators 27, 28 or another source), and all points that are spaced along current paths from the positive and negative supply reference points.

According to an aspect of this disclosure, an apparatus and method are provided for assessing IR voltage drop conditions. This is accomplished by monitoring the voltage conditions at test points 32, 33, especially along power supply conductors such as supply rails but potentially also other conductors, using an on-chip IR drop monitor 30, shown generally in FIG. 1 and disclosed in detail hereinafter.

The locations of the test points 32, 33 on the circuit can be selected in various ways that are beyond the scope of this disclosure. For example, it may be desirable to distribute the test points widely throughout the chip 20. For some purposes it may be useful to have test points at regular intervals or at points that bear comparison with one another in ways that are useful for design and diagnostic reasons. Inasmuch as loads all along the power supply conductors extract current that contributes to the IR voltage drop up to such loads, the test points might be concentrated at the more distal points along the power supply conductors for monitoring the worst case voltage drop conditions. The test points might be selectively associated with particular loads that are sensitive or can be representative points, for example points from which the power supply regulation scheme receives feedback. In the example shown, test points are distributed over the area of the circuit, including some test points 32 on the $V_{DD}$ rails and some test points on the $V_{SS}$ rails. It is also possible that that the more negative supply voltage could be a ground voltage. Points 33 can be provided to monitor for ground or low-supply-voltage bounce due to IR drop in the current path to the source of the negative supply voltage In any event, integrated circuit 20 has at least one conductor such as a $V_{DD}$ rail or a $V_{SS}$ rail or a conductor extending from one of said rails to a load terminal or the like, that forms a conductive path with a characteristic resistance, along which current is conducted. A test point 32 or 33, etc. along the conductive path is defined for monitoring the voltage at the test point, subject to one of an IR voltage drop or voltage bounce due to current flowing through one or more conductors between the test point 32 or 33 and the source of a supplied voltage. The IR voltage drop is due to the conductor comprising an electrical resistance (due to the conductor material and dimensions). The conductor typically carries current to one or more loads further along the conductor from the test point, an carries current from the regulated supply to loads coupled to the conductor at points that are closer than the test point to the regulated supply. The amount of the voltage drop over each incremental distance along the conductor is due to Ohm's law, E=IR. For purposes of convenience, the source of the supplied voltage will be generally described with respect to power supply voltages that have fixed nominal values and tolerances. This should not be construed to exclude voltage sources such as control levels and the like, that have variable values over some range.

In the exemplary embodiment, the IR drop monitor 30 carried on chip 20 is coupled to a reference voltage source, such as the $V_{DD}$ and $V_{SS}$ reference voltages produced by regulators 27, 28. In the examples discussed herein, the reference voltages are generally DC voltages derived from the power supply voltages coupled to the integrated circuit 20. It is also possible to provide a reference voltage from another source, such as a regulator that is not loaded by the integrated circuit in question, perhaps from a source such as an automatic test fixture that is temporarily coupled to the chip and provides supply voltages during testing. In another example, it is possible to employ a reference voltage source that produces a voltage that varies over a known time cycle so that the comparison of the voltage with the test point is accomplished at a predetermined time in the cycle when the amplitude of the reference voltage is known.

Figure 2:
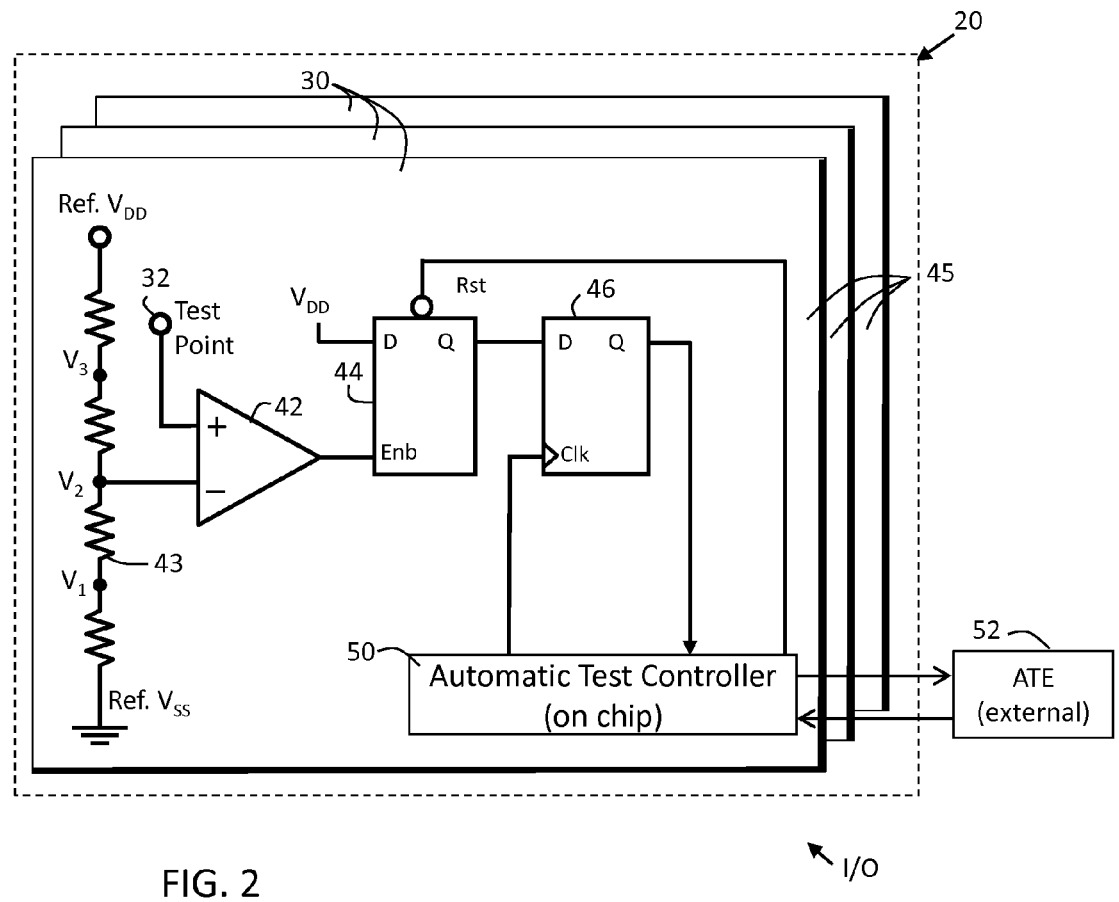
FIG. 2 is a schematic diagram showing a one-bit data collection circuit. Versions of this circuit are applied to multiple test points, to applying multiple thresholds at individual test points, and/or to discriminating for longer and shorter voltage excursions beyond a switching threshold.

The IR drop monitor comprises one or more comparators 42 having inputs coupled respectively to a test point 32, 33, etc. and to a threshold voltage reference. The comparator has an output that changes state when the test point voltage crosses the threshold voltage reference. Referring to FIG. 2, a threshold reference voltage is derived from the reference voltage source and provides an input to a comparator 42, the other input being coupled to the respective test point 32, or coupling to the comparator 42 a voltage derived from the voltage at the test point 32. In this example, threshold voltage $V_2$ is coupled to comparator 42. The comparator can comprise an operational amplifier as a differential amplifier with inverting and non-inverting inputs and a high gain. If the voltage at the test point crosses the threshold voltage $V_2$, the output of the comparator changes state. The value of the threshold voltage $V_2$ is determined by a voltage divider 43 having resistances coupled to the positive and negative reference voltages. In FIG. 2, the reference voltages are $V_{DD}$ and ground and the threshold voltage is equal to the ratio of the resistance between the comparator input and ground versus the resistance between Ref. $V_{DD}$ and ground, times the voltage at Ref. $V_{DD}$). Accordingly, at any predetermined point in time, the comparator output represents a measurement of whether the voltage at test point 32 is greater than or less than the threshold reference voltage $V_2$.

One or more latches or flip-flops 44, 46, coupled to the output of the comparator, serves as part of a digital register into which values representing the state of the comparator 42 are loaded, and from which an automatic test controller 50 can read the values. The latches and/or flip-flops are operated in coordination with operations of the automatic test controller 50. The automatic test controller can be an on chip state machine and digital circuit which can read the values from the flip-flops which store the state of comparator corresponding to IR drop value with respect to reference voltage.

An automatic test equipment (ATE) system 52, or another device that can exploit the testing and digitization of results according to the present disclosure can be coupled to various connection pins of the integrated circuit 20 (generally identified as the I/O signal path), or contacts can be applied to accessible points on the circuit elements. The ATE system 52 is coupled also to outputs of the automatic test controller 50 and can read information generated by the automatic test controller 50 using the comparator and latch or register arrangements as described. The inputs to ATE system 52 are not merely points at which the ATE system may be coupled in contact with edge pads or conductors exposed on the surface of the chip, but the inputs also include the generated digital outputs of IR drop monitor units 30.

As shown in FIGS. 1 and 2, the signaling connections between the automatic test controller 50 and the external stand-alone ATE 52 are bidirectional. In addition to passing test results from automatic test controller 50 to ATE 52 (uploading test results), the ATE can apply sequences of input signals in a so-called test pattern so as to control aspects of the operation of automatic test controller 50 (downloading test patterns, sequences, conditions or timing selections, for example).

A suitable ATE can be based on a conventional chip or chip package testing system, typically comprising a master controller (usually a computer) that synchronizes one or more source and capture instruments such as D/A and A/D converters. The circuit chip or package is a device under test (DUT) typically connected physically to the ATE by a robotic handler or prober that engages conductors on the chip and adapts the ATE's output and input resources to operationally unite the ATE with the chip, temporarily during testing. The engaged conductors can include input and output lines to the chip but also may include conductors that are accessible on the chip surface to contact with ATE probes. The ATE probes are part of a customized interface test adapter (ITA) or "fixture," typically customized for the chip design and able to adapt the ATE's resources to the DUT. The ATE can apply static levels or dynamically changing digital or analog levels, in a sequence or pattern designed to establish operational scenarios that exercise the chip.

The automatic test controller or other system generates data from the IR drop measurements as described, and records or otherwise responds to the resulting supply and/or signal levels at test points in the circuit, providing signals that result from the test pattern of applied signals as the stimulus, and from operation of the circuit on the chip. Ideally, a correctly operating chip is distinguishable from one operating incorrectly, based on the correspondence of the response of the chip to the response that the stimulus is expected to produce. The on-chip automatic test controller, for example, may have stored information defining what various levels or digital values should be if the circuit is operating correctly, and may compare the signal levels encountered on the chip against information that is associated with nominal conditions versus defect conditions. One or a series of different tests can be applied, e.g., timed according to a test system clock or according to a chip system clock. The latches or flip-flops 44, 46 are operated by the automatic test controller 50, at least including generation of reset signals to rearm the respective latch or register, in coordination with the sequential (optionally timed) steps of the test pattern, to discern IR drop conditions among other signal levels, when executing the test pattern.

The embodiment of the IR drop monitor shown in FIG. 2 comprises an exemplary one-bit data collection circuit 45. An on-chip IR drop monitor 30 preferably comprises multiple iterations of this one-bit data collection circuit, respectively coupled to a plurality of test points 32, 33, etc., distributed over points on the conductors of chip 20. Likewise, multiple iterations of this one bit circuit 45 provided in on-chip IR drop monitor 30 can be coupled to the same test points 32 or 33, with the respective iterations are coupled to switch at different voltage thresholds, such as $V_1$, $V_2$ or $V_3$ in FIG. 2. In another embodiment, the one-bit data collection circuits 45 are arranged to discriminate for longer or shorter pulse widths on the output of comparator 42, i.e., for excursions of the IR dropped voltage at test point 32 that last for a longer or shorter time.

It is possible to embody the on-chip test circuit 30 with a separate one-bit data collection circuit 45 for each of the monitored test points, and for each of a predetermined number of threshold switching voltages $V_1$, $V_2$, etc., and also for longer or shorter excursions. Alternatively, in a time division multiplex arrangement, the individual one-bit data collection circuits can be coupled by switches (not shown) to select among different available test points or different available thresholds.

In the embodiments shown as examples, the one-bit data collection circuits 45 (several being shown in the example of FIG. 2) are configured so that each such data collection circuit 45 is allocated to one test point 32, and to one threshold voltage $V_2$, and is triggered when the voltage at the test point passes the threshold. By providing multiple one-bit data collection circuits and operating them for a predetermined time, the outputs of the on-chip IR drop monitor 30 provide information as to how far the IR dropped at each test point 32, to a resolution equal to the voltage difference between the nearest threshold voltages, at any time during a testing interval. The output of a single one-bit data collection circuit can determine whether the voltage passed the applicable threshold voltage. If a given test point 32 is coupled to plural one-bit data collection circuits that respectively have threshold voltages that are incrementally spread over a voltage span that includes the highest and lowest possible voltages of interest, one can determine the voltage drop by determining which of the plural one-bit data collection circuits were triggered and which were not.

In FIG. 2, some timing aspects such as the testing interval until the one-bit data collection circuit is reset, are determined by the automatic test controller 50. The output of the comparator 42 is coupled to the enable input of a latch 44, the D input of which is tied a logical one level, namely $V_{DD}$ as shown. When the output of the comparator changes state because the voltage at test point 32 falls below the threshold voltage ($V_2$ as shown), the logical one level is shifted into the latch. The latch remains at logic one regardless of further excursions of the comparator output, unless the latch 44 is reset and thereby re-armed by a signal from automatic test controller 50.

The Q output of latch 44 is coupled to the D input of a D-type flip-flop 46. The automatic test controller 50, which accomplishes a predetermined sequence of operations, at one point applies a signal to the clock input of flip-flop 46, thereby loading the present level at the Q output of latch 44 into the flip-flop 46. This saves the value of the latch output in flip-flop 46. The controller 50 can reset the latch to test for a new excursion of the test point voltage below the threshold, or to test whether the excursion that originally set latch 44 is persisting.

Figure 3:
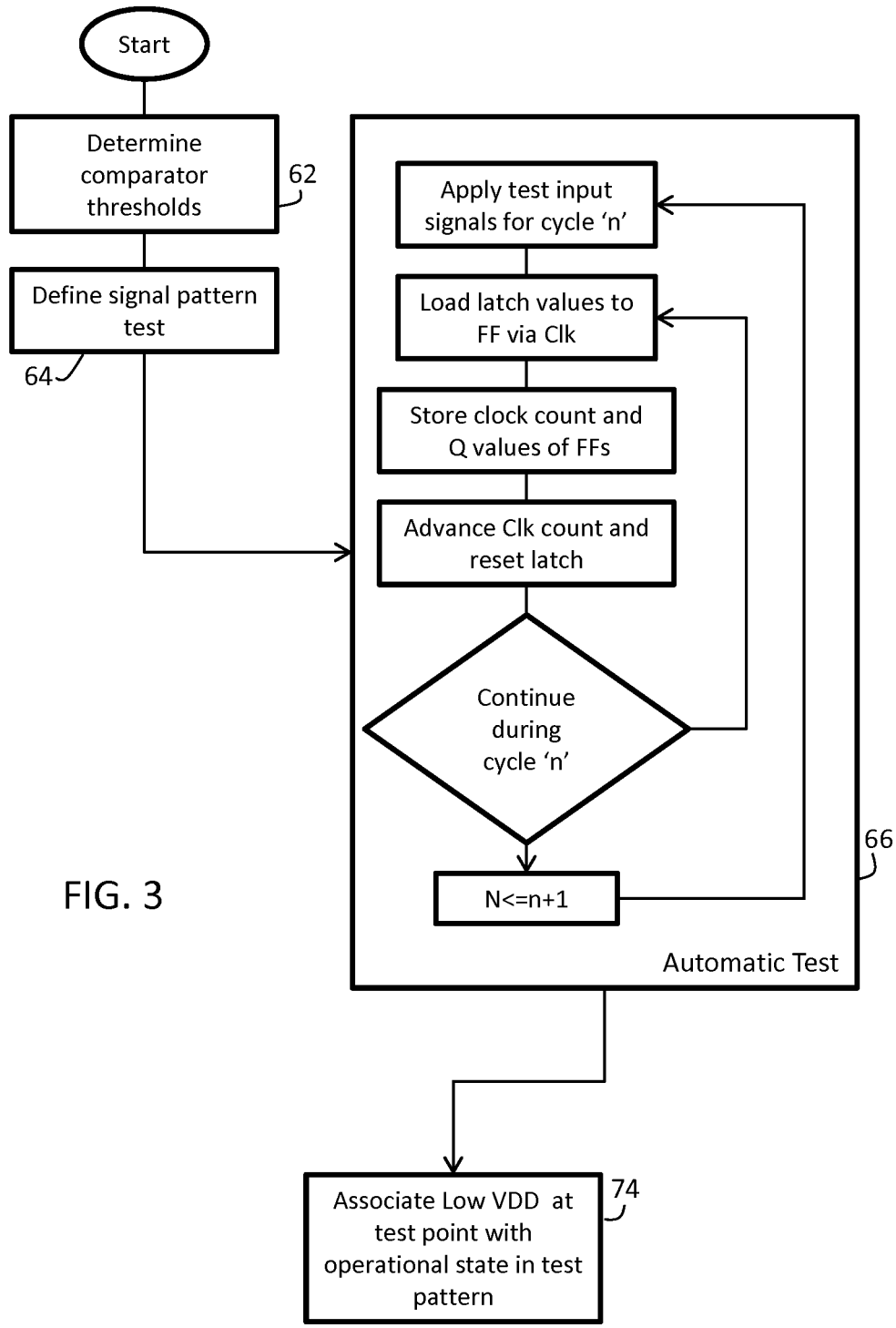
FIG. 3 is a flowchart showing an exemplary technique for employing an on-chip IR drop voltage monitor as shown in FIG. 2 in a simple form.

FIG. 3 is a flowchart showing an exemplary technique for employing an on-chip IR drop voltage monitor as shown in FIG. 2. As a preliminary step, it is possible to test the operation of the comparators 42 contained in some or all of the one-bit data collection elements 45, so as to determine exactly the voltages at which the comparators change state. In that case, a known voltage can be applied to either or both of the Ref. $V_{DD}$ or test point 32 and the resulting output of the comparators 42 is noted. The resistors of the voltage dividers can comprise polycrystalline silicon (useful to minimize the effects for manufacturing process variations). By selecting tap points along a length of resistance material and/or by ramping or otherwise varying the applied voltages, the one-bit measurement circuits are calibrated, as shown in FIG. 3 at step 62.

In connection with calibration, the threshold voltage can be tested or chosen if the reference voltage input is switchable or variable. The threshold voltage reference also can be varied over time operationally, for example to determine the test point voltage by sequentially applying to the comparator different threshold voltage references, or alternatively using a ramp voltage generator to apply a varying the threshold voltage reference in a sawtooth between minimum and maximum threshold values over a predetermined period during which the comparator output is repeatedly checked to determine whether the comparator has changed state. In the embodiments shown, however, the reference voltages are chosen and fixed.

At step 64, one or more test pattern sequences are defined, e.g., planned or selected and loaded into or otherwise provided, for example from ATE 52 into test controller 50. The test controller 50 can comprise a gate array arranged to conduct testing. In connection with a controller 50 responsive to an ATE 52, the ATE may comprise a processor with a stored program that effects the necessary sequence of testing steps. The ATE 52 and controller 50 coordinate to execute an automatic testing sequence, including monitoring IR drop conditions as shown at step 66. This sequence can be more or less complicated. In the embodiment shown, the test proceeds in cycles or steps "n," each of which can be a discrete sequence step or can be subdivided into a plurality of substeps.

Test input levels are applied to circuit 20 by ATE 52 through a test interface. Various specific interfaces are possible. If as a result of the input levels applied, the IR drop conditions at a monitored test point 32 cause the output of the associated comparator 42 to change state, latch 44 is set. At the end of step "n," the controller 50 applies signal Clk to load the Q output of latch 44 into flip-flop 46, which stores the digital level as a value in a manner accessible to test controller 50 at the Q output of flip-flop 46. A reset generator (preferably the controller 50) generates reset signals a intervals to reset the latch 44 for a new measurement and read the value from the Q output of flip-flop 46, for example once per cycle "n" or repeatedly during substeps during which the controller reads the latch Q output into the flip-flop (or a similar storage register) and resets the latch 44 for another measurement. The controller coordinates the test cycles with the patterned test cycles "n," and optionally also with subcycle steps, proceeding with the predetermined number of one or more clocks until proceeding into the next cycle "n," when the test pattern dictates a different set of inputs to be applied to the circuit 22.

The on-chip test controller 50 can be configured to store the values stored in all the flip-flops 46 and to compare them to determine the greatest IR drop (namely a voltage between the lowest threshold and the next lower threshold of the one-bit data collection units 45) found among several one-bit data collection units 45 with the same test point and different thresholds. Alternatively, the values that are stored can be reported to the stand-alone ATE 52 as the testing process proceed. The results for all or a subset of the test points during programmed cycles "n" are accumulated and preferable reported to the ATE 52.

The ATE 52 can employ the test results in various ways. During circuit design stages, the results enable the generation of test results that highlight and help to resolve differences between IR drop conditions expected from design simulations versus actual experience testing prototypes. When generating specifications and stating tolerance and reliability values, the test results can be used to bolster expectations that IR drop conditions will be such that the circuit can be assured to operate provided that the input voltages V+ and V− are kept to stated minimum voltages. During regular production, testing can be used in quality assurance pass/fail testing to select or reject production according to variances that may be caused by typical variations in production parameters. The testing also can be conducted when elements of the circuit are stressed, for example by extreme temperatures, high bias level conditions causing leakage and other scenarios.

The present disclosure refers to an integrated circuit chip 20 as the subject of the testing techniques disclosed. It should be appreciated that these techniques are applicable to chips of various functions, packaged or unpackaged, when separate or when coupled to other elements, or as parts of completed assemblies. Therefore, systems incorporating the developments and techniques discussed herein can include any industrial production chip such as a CPU, device drivers, memory arrays and controllers, or similar devices capable of having comparators, latches and on-board test control elements included on-board. Apt systems also include devices in which such chips are included in assembled systems such as a wireless unit, mobile phone, processor or the like, wherein it is possible to apply appropriate input signals to drive the devices and to monitor IR drop data.

Figure 4:
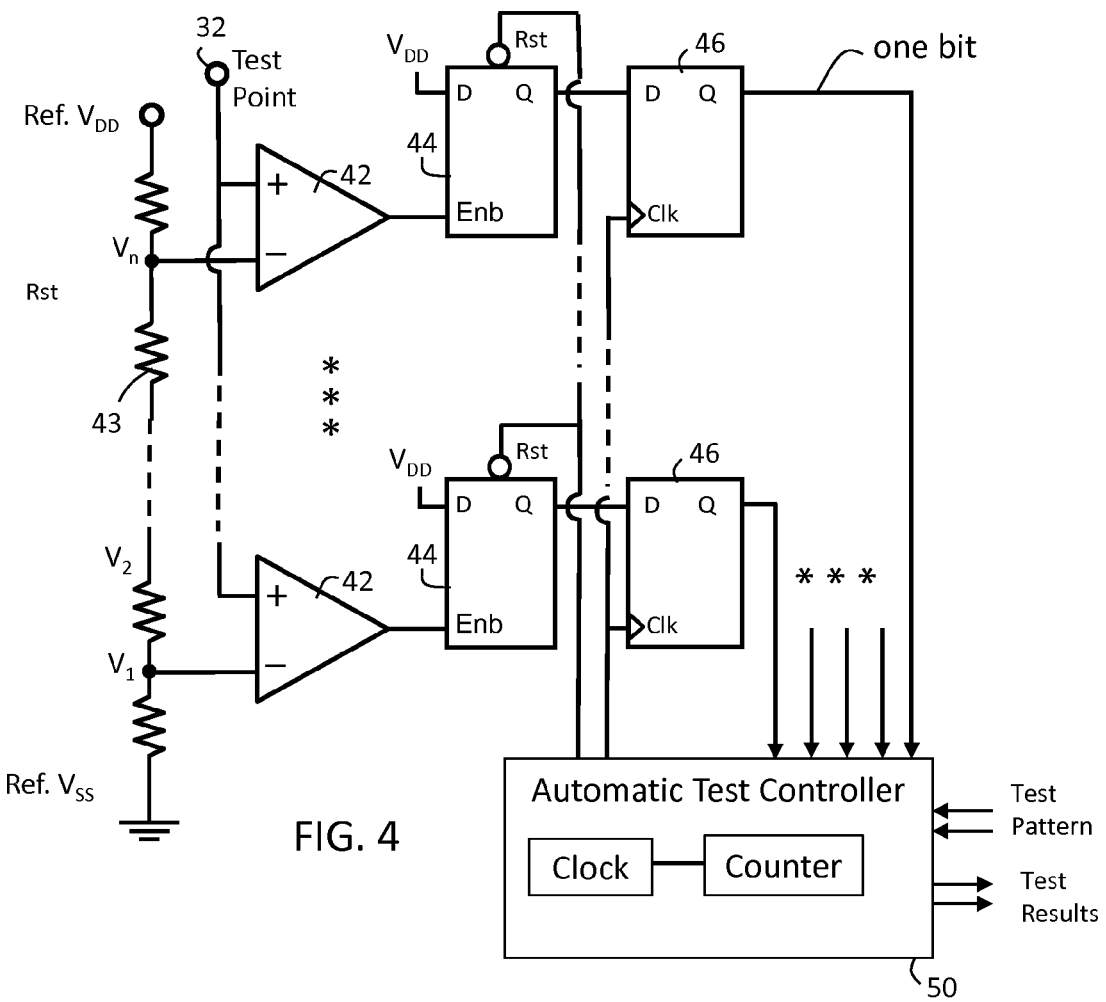
FIG. 4 is a schematic illustration of an embodiment according to FIG. 2 but configured to test for multiple thresholds.
Figure 5:
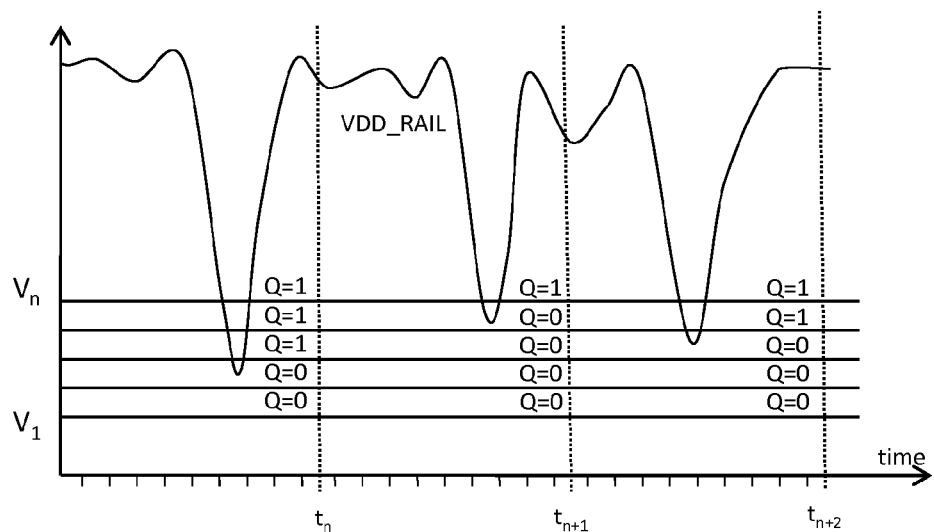
FIG. 5 is a timing diagram showing discrimination at a plurality of threshold voltages $V_1$ to $V_n$ in each of a plurality of time intervals $t_n$ defined by register-load and latch-reset operations that are timed from an on-chip automatic test controller.

FIG. 4 is a schematic illustration of an embodiment according to FIG. 2 but specifically illustrates an arrangement with one-bit data collection units coupled to a single test point 32 and configured to test for multiple thresholds $V_1 \ldots V_n$. The same reference numbers are used in FIGS. 4 and 2 to identify corresponding elements, and the description of FIG. 2 applies as well to the elements of FIG. 4. In an on-chip test circuit as shown in FIG. 4, the timing diagram of FIG. 5 shows the Q output values that are obtained from the respective flip-flops 46, considering a repetitive minimum time inter $t_n$ along the X axis and threshold voltages $V_1$ to $V_n$ shown along the Y axis as the $V_{DD}$ rail signal varies over time as shown. Each of the plurality of time intervals $t_n$ has one register-load and latch-reset operation by the automatic test controller 50 in this illustration, thereby producing one value of Q for each one-bit unit 45. The lowest level of IR drop is found by determining the adjacent threshold voltages where the Q values differed.

Figure 6:
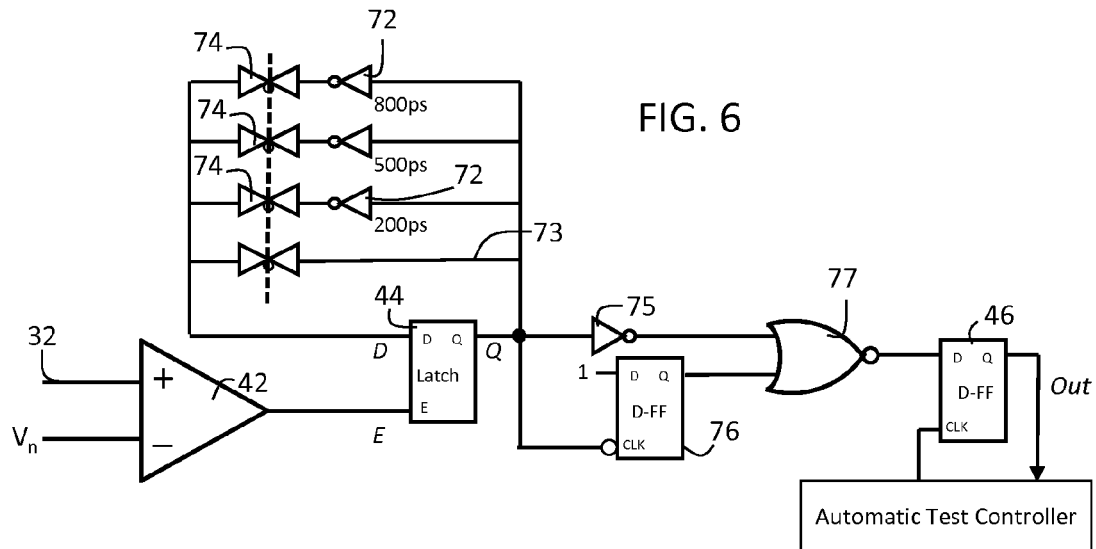
FIG. 6 shows an alternative embodiment configured to distinguish for IR voltage drop excursions that persist for selected time periods.
Figure 7:
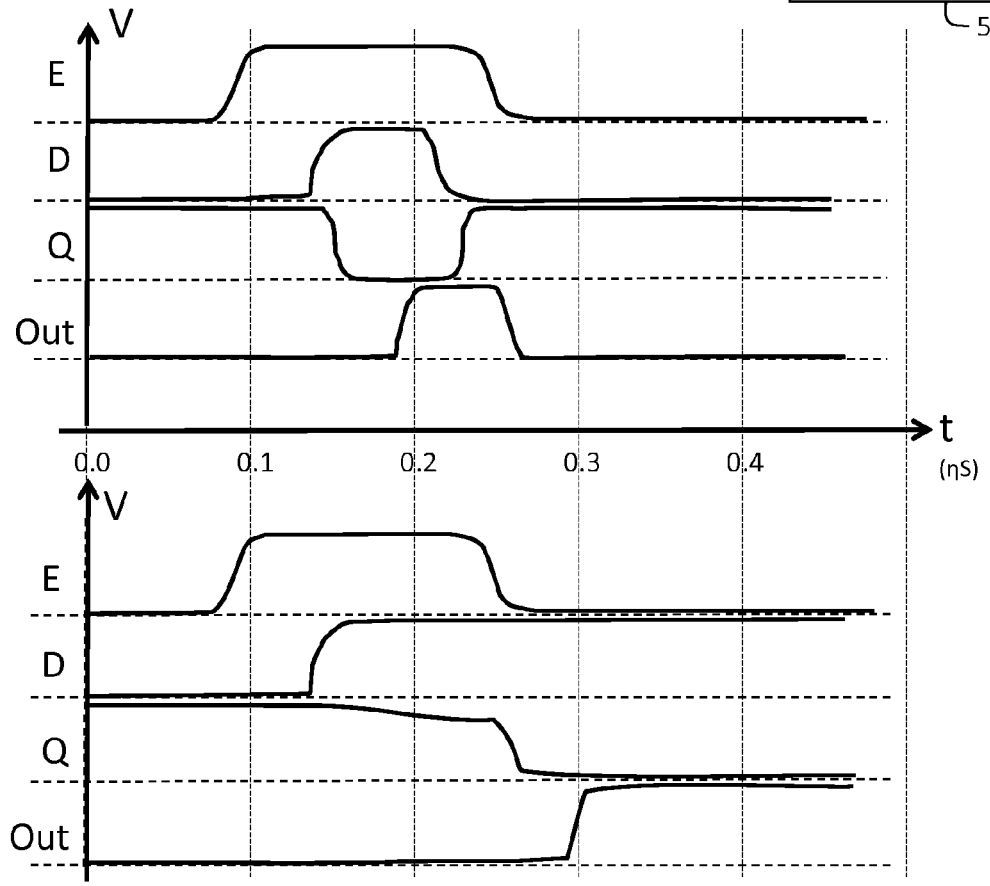
FIG. 7 is a dual timing chart comparing signal levels at identified points in the circuit of FIG. 6 when discriminating for excursions that persist for a time within a given time window (200 to 500 pS) selected according to FIG. 6.

FIG. 6 shows an alternative embodiment configured to distinguish for IR voltage drop excursions that persist for longer or shorter selected time periods. The embodiment shown in FIG. 6 consists of a time delay generator coupled with the circuit shown in FIG. 2. The purpose of the time delay generator circuit is to discriminate the IR drop voltages occurring within a given time window. FIG. 7 is a dual timing chart that compares the signal levels at the output E of comparator 42 (which is the enabling input to latch 44) comparing signal levels at identified points in the circuit of FIG. 6 when discriminating for excursions that persist for a time within a given time window (200 to 500 pS) selected according to FIG. 6.

The apparatus for assessing IR voltage drop conditions in the embodiment of FIG. 6 is similar to FIG. 2 in that a reference voltage source (not shown) provides a threshold reference voltage $V_n$ at least at a predetermined point in time, coupled as an input to comparator 42. The other input of comparator 42 is coupled to a voltage from test point 32, such that the output of the comparator changes state when the test point voltage crosses the threshold voltage reference. A latch 44 coupled to the output of the comparator 42 is enabled by signal E and loads the value at the D input of latch 44 onto the Q output of said latch 44. The D input is normally low, as shown in FIG. 7. Thus the Q output of latch 44 goes low. A logical "1" is clocked into flip-flop 76 and the output of NOR gate 77 goes high. If the ATE controller operates the CLK input to D flip-flop 46, the overall output will be 1.

The Q output of latch 44 is coupled though one of several selectable pass gates 74 to the D input of the same latch 44. One of the lines 73 selectable by one of the pass gates 74 has no associated delay and when selected changes the state of the Q output and loads a logic "1" level into flip-flop 76 via the associated CLK input. If one of the other pass gates is selected, the D input to latch 44 stays low until one of the inverters 72 selected by enabling an associated pass gate 74 changes state. If the output of comparator 42 is still high (namely if the IR drop voltage is still beyond the threshold at comparator 42, the Q output now goes high and the output of inverter 75 goes low. The two inputs to NOR gate 77, namely the outputs of inverter 75 and flip-flop 76 are now at different logic levels. The output of NOR gate 77 goes high.

As shown in the signal levels versus time graphs in FIG. 7, the result is to select for excursions at the output of comparator 42 that are of a predetermined duration, the discriminating factor in the one-bit unit being the propagation delay selected (or not) through inverters 72 by enabling one of the pass gates 74 only.

The on-chip testing apparatus for monitoring voltage levels in an integrated circuit as described can be embodied in additional particular configurations. It should be understood, for example, that the coupling of signals and voltages as described does not require direct coupling and additional elements may be included in conjunction with those that carry out the functions described above. Likewise, the elements that are described, such as portions of the automatic test controller 50, can be located on the integrated circuit or partly as an external control element or aspect of the ATE 52 or its associated chip interface. These and other variations are encompassed by this description and the associated claims.

The method steps for on-chip IR testing in accordance with this disclosure include defining one or more test points 32, 33 on one or more conductors within an integrated circuit 22, the test point having a test point voltage during operations to be tested. A source of a reference voltage and the test point voltage are coupled to inputs of a voltage comparator 42. When operating or exercising the integrated circuit, crossing of the test point voltage and the reference voltage relative to one another causes an output of the comparator to change state. A latch 44 is set in a case when the output of the comparator changes state, thereby providing a one bit indication that the test point voltage has crossed the reference voltage. This one bit indication is noted or read or stored at a predetermined time. The latch 44 is reset to enable a new measurement.

In some embodiments, the latch value is loaded into a register defined by one or more flip-flops 46. The clocking of the flip-flop 46 to load the latch value and the resetting of the latch 44 are accomplished by a controller 50, preferably but not necessarily in conjunction with the application of a test pattern to the integrated circuit by an automatic test equipment apparatus 52. Thus, the latch output value is clocked into the flip-flop register at a predetermined time in a test pattern. The state of the latch output value is associated with that predetermined time and thereby associates the IR drop results with the results of applying the test pattern.

The test point can be coupled to a power rail of one of a more positive supply voltage and a more negative supply voltage or ground. The reference voltage defines a test level or one of a series of incrementally spaced test levels that the IR voltage drop may reach, according to a span of measurement provided by using a number of comparators as one-bit measurement units for each test point, each one-bit unit having an incrementally different threshold voltage. In certain embodiments disclosed as examples, multiple one-bit measurement units (multiple comparators) with different thresholds are provided for each test point.

It is possible to provide for selectively switching a smaller number of one-bit measurement units to different threshold voltages or to couple to different test points. However, the disclosed embodiments with a separate comparator for each test point and each reference voltage provide the maximum versatility with respect to the time of measurement. The comparator output level can be read and sampled according to a programmed schedule. By selectively varying a time interval between setting and resetting the latch, longer and shorter intervals in which the test voltage remains greater than or less than the reference voltage can be discriminated. In another embodiment, a series of delay lines and associated gates can pass or reject detection of excursions of the IR voltage drop beyond the threshold for selected maximum or minimum pulse widths or between a window defined by both a maximum and a minimum.

Apart from test apparatus as such, the present disclosure concerns integrated circuits that are permanently and integrally provided with comparators that function as on-chip test arrangements. Therefore, as disclosed, an integrated circuit 20 has at least one point (such as Ref. $V_{CC}$ in FIG. 1) to which at least one of a power supply, a control and a signal source is coupleable to provide a supply of voltage at a source voltage to a conductor (such as $V_{CC}$ Rails in FIG. 1). The conductor inherently defines an electrical resistance and extends from said point to a terminal of an electrical load that sinks current from the supply of voltage. At least one test point 32, 33 is defined along the conductor between the electrical load and the supply of voltage. The test point voltage at the test point is subject to an IR voltage difference from the source voltage, due to current flowing through the conductor between the supply of voltage and the terminal of the load. At least one reference voltage source (such as $V_1$, $V_2$, $V_3$ in FIG. 2) provide a threshold reference voltage at least at a predetermined point in time. At least one comparator 42 has inputs coupled respectively to the test point 32 and to the threshold voltage reference. The comparator having an output that changes state when the test point voltage crosses the threshold voltage reference. At least one digital circuit 44, 46 is responsive to the output of the comparator 42 for determining whether the test point voltage passes the threshold voltage reference during a test interval.

A plurality of said comparators 42, 45 can be coupled each such test point and to different threshold voltage references within a span of possible test point voltages. The digital circuit 44, 46, etc. is responsive to the plurality of comparators for sensing the test point voltage within the span. Instead or in addition, a plurality of comparators can be coupled to test points distributed among various conductors on the integrated circuit, and each of the test points can be associated with multiple comparators, or each test point to one comparator having a time varying reference input, likewise for sensing how the test point voltage varies during one test interval or successive test intervals.

The subject matter has been disclosed in connection with exemplary embodiments and examples. It should be understood that the subject matter is not limited to the examples, and reference should be made to the appended claims to assess the scope of the invention in which exclusive rights are claimed.

We claim:

1. An apparatus for assessing IR voltage drop conditions, comprising:

an integrated circuit having at least one conductor defining a test point voltage subject to one of an IR voltage difference due to current flowing through a conductor between the test point and one of two supply voltages, the conductor comprising an electrical resistance;

a reference voltage source providing a threshold reference voltage at least at a predetermined point in time;

at least one comparator having inputs coupled respectively to the test point and to the threshold voltage reference, the comparator having an output that changes state when the test point voltage crosses the threshold voltage reference;

at least one latch circuit coupled to the output of the comparator, the latch circuit being operated in coordination with the comparator to load the state of the output of the comparator;

a reset generator coupled to reset the latch at a predetermined point in one of a sequence and a timed cycle;

a time delay generator having at least two time periods, the time delay generator being coupled to reset the latch after a selected one of said time periods, for distinguishing between transits of the test point voltage beyond the threshold reference voltage that are longer and shorter than the selected one of said time periods; and an output coupled to the latch circuit, for at least one of recording, signaling and indicating a state of the latch indicating said crossing of the test point voltage and the threshold voltage reference.

2. The apparatus for assessing IR voltage drop conditions according to claim 1, comprising a plurality of said comparators respectively coupled to individual said test points in the integrated circuit, each of said comparators and respective individual test points providing a one bit indication of the test point voltage passing the threshold voltage reference.

3. The apparatus for assessing IR voltage drop conditions according to claim 1, comprising a plurality of said comparators respectively coupled a same said test point in the integrated circuit, and to differing threshold voltage references, each of said comparators and respective threshold voltage references providing a one bit indication of a voltage at the same said test point passing one of the differing threshold voltage references, whereby the one bit indications for said plurality of comparators identifies a maximum excursion of the test point voltage over a range encompassed by the differing threshold voltages.

4. The apparatus for assessing IR voltage drop conditions according to claim 2, comprising a plurality of said comparators respectively coupled a same said test point in the integrated circuit, and to differing threshold voltage references, each of said comparators and respective threshold voltage references providing a one bit indication of a voltage at the same said test point passing one of the differing threshold voltage references, whereby the one bit indications for said plurality of comparators identifies a maximum excursion of the test point voltage over a range encompassed by the differing threshold voltages.

5. The apparatus for assessing IR voltage drop conditions according to claim 4, wherein the comparators and the latch circuits to which the outputs of the comparators are coupled, are elements of an automated test controller carried on the integrated circuit.

6. The apparatus for assessing IR voltage drop conditions according to claim 5, wherein the automatic test controller is coupled to an automatic test equipment apparatus external to the integrated circuit, applicable to apply a test pattern to exercise the integrated circuit during execution of a test pattern.

7. The apparatus for assessing IR voltage drop conditions according to claim 5, wherein the reset generator is coupled to the latch circuit, the latch circuit comprising a latch enabled by a change in state of the comparator to load a predetermined logic level presented at an output of the latch, and a flip-flop enabled by a clock signal to load the logic level presented at the output of the latch, wherein the automatic test controller applies a clock signal to the flip-flop to load the logic level presented at the output of the latch and a pulse to reset the latch.

8. The apparatus for assessing IR voltage drop conditions according to claim 7, wherein the automatic test controller comprises on chip gating configured to control a sequence of events by which the comparators are operated and outputs are read out, and wherein the automatic test controller is capable of communicating said outputs to an external system.

9. The apparatus for assessing IR voltage drop conditions of claim 1, wherein the reference voltage source is variable at least for calibrating a threshold voltage of the comparator.

10. A method for monitoring voltage levels in an integrated circuit, comprising:

defining at least one test point, within the integrated circuit, the test point having a test point voltage;

providing a source of a reference voltage;

coupling the test point and the source of the reference voltage to inputs of a voltage comparator, and operating the integrated circuit, whereby crossing of the test point voltage and the reference voltage relative to one another causes an output of the comparator to change state;

setting a latch in a case when the output of the comparator changes state for indicating that said crossing of the test point voltage and the reference voltage has occurred;

selectively varying a time interval associated with setting and resetting the latch, for discriminating for longer and shorter intervals in which the test voltage remains greater than or less than the reference voltage; and, reading and subsequently resetting the latch according to a repeating test pattern.

11. The method of claim 10, wherein the test point is coupled to a power rail of one of a more positive supply voltage and a more negative supply voltage and the reference voltage defines a test level of one of IR voltage drop of the more positive supply voltage and IR voltage increase at the more negative supply voltage.

12. The method of claim 11, comprising applying said reference voltage at least at one of a plurality selectable reference voltage levels and a plurality of test points substantially simultaneously.

13. The method of claim 11, comprising applying a plurality selectable reference voltage levels over a test range, to each of a plurality of test points substantially simultaneously, using individual said comparators having associated latches, and determining from reading said latches a maximum excursion of the test point voltage in the range.

14. The method of claim 13, further comprising applying to the integrated circuit a test pattern having varying input conditions over time; repetitively determining the maximum excursion of the test point voltage at predetermined times in the test pattern; and associating the maximum excursion at the predetermined times with associated said input conditions.

15. An integrated circuit comprising:

at least one point to which at least one of a power supply, a control and a signal source is coupleable to provide a supply of voltage at a source voltage to a conductor, wherein the conductor defines an electrical resistance and extends from said point to a terminal of an electrical load that sinks current from the supply of voltage;

at least one test point defined along the conductor between the electrical load and the supply, wherein a test point voltage at the test point is subject to an IR voltage difference from the source voltage due to current flowing through the conductor between the supply of voltage and the terminal of the load;

at least one reference voltage source providing a threshold reference voltage at least at a predetermined point in time;

at least one comparator having inputs coupled respectively to the test point and to the threshold voltage reference, the comparator having an output that changes state when the test point voltage crosses the threshold voltage reference;

at least one digital circuit responsive to the output of the comparator for determining whether the test point voltage passes the threshold voltage reference during a test interval; and a time delay generator coupled to one of the comparator and the digital circuit, wherein the time delay generator discriminates for excursions of the test point voltage that persist for longer than a time determined from the time delay generator.

16. The integrated circuit of claim 15, comprising a plurality of said comparators respectively coupled the test point and to different threshold voltage references within a span of possible test point voltages, wherein the digital circuit is responsive to the plurality of comparators for determining one of a maximum and a minimum of the test point voltage within the span.

17. The integrated circuit of claim 15, comprising a plurality of said comparators, each coupled to one of a plurality of said test points distributed among conductors on the integrated circuit.

18. The integrated circuit of claim 16, wherein a plurality of said comparators respectively coupled to at least some of the plurality of test points, and to different threshold voltage references within spans of possible test point voltages for respective ones of the plurality of test points, wherein the digital circuit is responsive to the plurality of comparators for determining one of a maximum and a minimum of the test point voltage within said spans.

* * * * *